(12) United States Patent
Kim et al.

(10) Patent No.: US 11,435,828 B2
(45) Date of Patent: *Sep. 6, 2022

(54) TOUCH SENSITIVE DEVICE AND DISPLAY DEVICE INCLUDING THE SAME

(71) Applicant: LG DISPLAY CO., LTD., Seoul (KR)

(72) Inventors: ChiWan Kim, Goyang-si (KR); TaeHeon Kim, Seoul (KR); SungEui Shin, Seoul (KR); YongWoo Lee, Goyang-si (KR); KyungYeol Ryu, Goyang-si (KR); YuSeon Kho, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 188 days.

This patent is subject to a terminal disclaimer.

(21) Appl. No.: 16/163,262

(22) Filed: Oct. 17, 2018

(65) Prior Publication Data

US 2019/0113977 A1     Apr. 18, 2019

(30) Foreign Application Priority Data

Oct. 18, 2017   (KR) .................. 10-2017-0135462

(51) Int. Cl.
*G06F 3/041* (2006.01)
*G06F 3/01* (2006.01)
*C08G 79/025* (2016.01)

(52) U.S. Cl.
CPC ........... *G06F 3/016* (2013.01); *C08G 79/025* (2013.01); *G06F 3/041* (2013.01)

(58) Field of Classification Search
CPC ........ G06F 3/016; G06F 3/041; G06F 3/0412; G06F 3/044; G06F 3/0445; G06F 2203/04111; G06F 2203/04112; C08G 79/025; G02F 1/13338; B32B 5/16; B32B 7/022; B32B 2457/202; B32B 2457/206;
(Continued)

(56) References Cited

U.S. PATENT DOCUMENTS 4,448,295 A     5/1984   Shibuta et al.
4,933,479 A *   6/1990   Kotaka ................. H01L 41/193
                                                 310/800
(Continued)

FOREIGN PATENT DOCUMENTS

CN     102800810 A    11/2012
CN     105739754 A     7/2016
(Continued)

*Primary Examiner* — Lunyi Lao
*Assistant Examiner* — Jarurat Suteerawongsa
(74) *Attorney, Agent, or Firm* — Birch, Stewart, Kolasch & Birch, LLP (57) ABSTRACT

Provided is a touch sensitive device including an electroactive layer formed of an electroactive matrix, wherein the electroactive matrix has a structure in which a piezoelectric ceramic and an electroactive polymer (EAP) are bonded and an electrode disposed on at least one surface of the electroactive layer. According to an exemplary embodiment of the present disclosure, the touch sensitive device uses an electroactive matrix has an excellent transparency, can be made thin, and has a high piezoelectric property so that the light transmittance and the vibration intensity of the touch sensitive device can be improved.

15 Claims, 8 Drawing Sheets

(58) Field of Classification Search
CPC .. B32B 2457/208; H01B 3/445; H01L 27/323
See application file for complete search history.

(56) References Cited

U.S. PATENT DOCUMENTS

| | | | | |
|---|---|---|---|---|
| 8,471,442 | B2* | 6/2013 | Hatano | H01L 41/1873 310/358 |
| 10,611,883 | B2* | 4/2020 | Kim | C09D 185/04 |
| 10,752,737 | B2* | 8/2020 | Kim | G06F 3/0412 |
| 10,795,470 | B2* | 10/2020 | Ryu | C08G 79/025 |
| 2001/0043546 | A1* | 11/2001 | Kumacheva | G11B 7/00455 369/103 |
| 2002/0011111 | A1* | 1/2002 | Otsuchi | G01P 15/0888 73/514.34 |
| 2003/0067449 | A1* | 4/2003 | Yoshikawa | G06F 3/016 345/173 |
| 2004/0010028 | A1* | 1/2004 | Nuckolls | B82Y 30/00 514/410 |
| 2006/0207720 | A1* | 9/2006 | Yoshizawa | B41J 2/1609 156/325 |
| 2007/0008675 | A1* | 1/2007 | Maliakal | B81B 3/0021 361/311 |
| 2007/0139216 | A1* | 6/2007 | Breed | G08C 17/00 340/13.24 |
| 2008/0229831 | A1* | 9/2008 | Serban | B81C 1/00206 73/589 |
| 2010/0127206 | A1 | 5/2010 | Choi et al. | |
| 2012/0161588 | A1* | 6/2012 | Hatano | C04B 35/495 310/365 |
| 2013/0172052 | A1* | 7/2013 | Bengtsson | G06F 3/0416 455/566 |
| 2013/0194084 | A1 | 8/2013 | Lacroix et al. | |
| 2013/0334930 | A1* | 12/2013 | Kang | H01L 41/312 310/339 |
| 2014/0042875 | A1* | 2/2014 | Suenaga | C01G 33/006 29/25.35 |
| 2016/0042217 | A1* | 2/2016 | Kim | G06K 9/0002 382/124 |
| 2016/0092016 | A1* | 3/2016 | Yoshida | G06F 3/041 345/174 |
| 2016/0187985 | A1* | 6/2016 | Lim | G06F 3/0412 345/173 |
| 2017/0090649 | A1* | 3/2017 | Lee | G06F 3/044 |
| 2017/0321023 | A1* | 11/2017 | Ali | H01L 41/183 |
| 2018/0029078 | A1* | 2/2018 | Park | H01L 41/0477 |
| 2019/0018509 | A1* | 1/2019 | Ryu | G06F 3/041 |

FOREIGN PATENT DOCUMENTS

| | | |
|---|---|---|
| CN | 105742480 A | 7/2016 |
| CN | 107085466 A | 8/2017 |
| DE | 10 2015 107 058 A1 | 11/2016 |
| KR | 10-2010-0058220 A | 6/2010 |
| KR | 10-2011-0119403 A | 11/2011 |
| KR | 10-2013-0060998 A | 6/2013 |
| KR | 10-2013-0089211 A | 8/2013 |
| KR | 10-2016-0071804 A | 6/2016 |
| KR | 10-1761055 B1 | 7/2017 |

* cited by examiner

TOUCH SENSITIVE DEVICE AND DISPLAY DEVICE INCLUDING THE SAME

CROSS-REFERENCE TO RELATED APPLICATIONS

This application claims priority from and the benefit under 35 U.S.C. § 119(a) of Korean Patent Application No. 10-2017-0135462 filed on Oct. 18, 2017, in the Korean Intellectual Property Office, the disclosure of which is incorporated herein by reference.

BACKGROUND OF THE INVENTION

Field of the Invention

The present disclosure relates to a touch sensitive device and a display device including the same, and more particularly to a touch sensitive device including an electroactive matrix with improved permittivity and a display device including the same.

Description of the Related Art

In response to recent demand from users who want to conveniently use various display devices including a liquid crystal display device and an organic light emitting display device, a touch-type display device in which a user touches a display device to input information is commonly produced. Accordingly, studies for utilizing a haptic device to provide direct and various touch feedback to the user are continuously performed. Specifically, since the haptic device of the related art is attached to a rear surface of the display panel, it is difficult to provide immediate and minute feedback on the touch of the user. Therefore, studies have been actively conducted to place a haptic device on the display panel to provide various and direct feedback that is sensitive to the user's touch.

In the related art, such as a haptic device, a vibration motor such as an eccentric rotating mass (ERM) or a linear resonant actuator (LRA) has been used. The vibration motor is configured to vibrate the entire display device, which results in several problems. These problems include the need to increase the size of the mass body in order to increase the vibration intensity, the difficulty of frequency modulation for controlling the degree of vibration, and the slow response speed. Further, since the eccentric rotating mass and the linear resonant actuator are formed of an opaque material, it is difficult to dispose the eccentric rotating mass and the linear resonant actuator on the display panel.

In order to solve the above-described problems, a shape memory alloy (SMA) and piezoelectric ceramics have been developed as a material for a haptic device. However, the shape memory alloy (SMA) has a slow response speed and a short lifespan and is formed of an opaque material. Specifically, piezoelectric ceramics have a high piezoelectric property, but have a low durability against an external impact, so piezoelectric ceramics are easily broken by the external impact. Further, piezoelectric ceramics are opaque and difficult to be made thin.

Therefore, a haptic device using an electroactive polymer (EAP) has attracted recent attention. An electroactive polymer refers to a polymer which can be modified by electrical stimulation and can be repeatedly expanded, contracted, and bent by electrical stimulation. As such, an electroactive polymer, a ferroelectric polymer and a dielectric elastomer can be used. Specifically, as the ferroelectric polymer, polyvinylidene fluoride (hereinafter, abbreviated as PVDF) polymer having a relatively high piezoelectricity has attracted attention.

The electroactive polymer EAP has the advantages of being excellent in transparency and being easy to be made thin. However, in order to be used in a mobile display device, the electroactive polymer has disadvantages including a separate process, such as a poling process or a stretching process using a high voltage, is necessary for an electronic device and a high driving voltage is necessary due to an insufficient piezoelectric property.

SUMMARY OF THE INVENTION

An object of the present disclosure is to provide a touch sensitive device which has an excellent transparency and is easy to be made thin and includes an electroactive matrix having a high piezoelectric property and a display device including the same.

Another object of the present disclosure is to provide an environmentally friendly touch sensitive device having flame retardation and non-toxic characteristics and a display device including the same.

Still another object of the present disclosure is to provide a touch sensitive element which directly functions as a bending member, such as a hinge when it is applied to a flexible display device to simplify the manufacturing process, the configuration and a display device including the same.

According to an aspect of the present disclosure, a touch sensitive device includes: an electroactive layer formed of an electroactive matrix in which a piezoelectric ceramic and an electroactive polymer (EAP) are bonded and an electrode disposed on at least one surface of the electroactive layer. According to an exemplary embodiment of the present disclosure, the touch sensitive device uses an electroactive matrix having an excellent transparency, easiness to be made thin, and a high piezoelectric property so that the light transmittance and the vibration intensity of the touch sensitive device can be improved.

According to another aspect of the present disclosure, a display device includes a display panel and a touch sensitive device above or below the display panel, wherein the touch sensitive device includes an electroactive layer formed of an electroactive matrix in which a piezoelectric ceramic and an electroactive polymer are bonded by a hydrogen bond.

Other detailed matters of exemplary embodiments are included in the detailed description and the drawings.

According to the present disclosure, an electroactive layer, formed of an electroactive matrix in which a piezoelectric ceramic and an electroactive polymer are bonded, is used so that dielectric constant is improved as compared with the electroactive polymer of the related art, thereby improving a driving displacement and vibration intensity of the touch sensitive device.

The present disclosure provides a touch sensitive device having an improved light transmittance as compared with piezoelectric ceramics of the related art.

Further, according to the present disclosure, a KNN based piezoelectric ceramics material is used so that various accidents occurring during the manufacturing process can be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for the convenience of description, and the present disclosure is not limited to the size and the thickness of the component illustrated.

The features of various embodiments of the present disclosure can be partially or entirely adhered to or combined with each other and can be interlocked and operated in technically various ways as understood by those skilled in the art, and the embodiments can be carried out independently of or in association with each other.

Hereinafter, various exemplary embodiments of the present disclosure will be described in detail with reference to accompanying drawings.

Touch Sensitive Device

Figure 1:
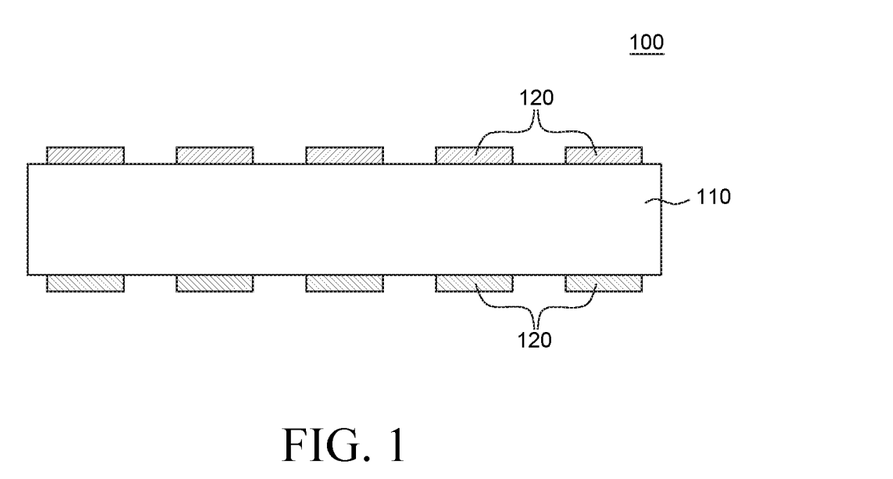
FIG. 1 is a schematic cross-sectional view illustrating a touch sensitive device according to an exemplary embodiment of the present disclosure.

FIG. 1 is a schematic cross-sectional view illustrating a touch sensitive device according to an exemplary embodiment of the present disclosure. All the components of the touch sensitive device according to all embodiments of the present disclosure are operatively coupled and configured. Referring to FIG. 1, a touch sensitive device 100 according to an exemplary embodiment of the present disclosure includes an electroactive layer 110 and an electrode 120.

Electrode

The electrode 120 applies an electric field to the electroactive layer 110 to induce vibration or bending by electrical stimulation. The electrode 120 can be disposed in various forms and in various numbers as needed. For example, a plurality of electrodes 120 can be disposed on an upper surface and a lower surface of the electroactive layer 110 as illustrated in FIG. 1, or a plurality of electrodes 120 can be disposed on any one of the upper surface and the lower surface of the electroactive layer 110. Spaces can be formed between adjacent electrodes 120.

Specifically, the electrodes 120 can be disposed on the upper surface and the lower surface of the electroactive layer 110, respectively. In this case, the electrode 120 disposed on the upper surface of the electroactive layer 110 extends in an X axis direction and the electrode disposed on the lower surface of the electroactive layer 110 extends in a Y axis direction. Therefore, the electrodes can have a vertical arrangement structure in which the electrodes intersect each other to form a matrix. Further, the electrodes 120 can have a horizontal arrangement structure in which the electrodes 120 are disposed on only one surface of the electroactive layer 110. Furthermore, the electrodes 120 can have a multilayer structure in which the plurality of electrodes 120 is disposed on the upper surface and the lower surface of the electroactive layer 110 in one cell to be opposite to each other so that both a vertical arrangement structure and a horizontal arrangement structure of the electrodes 120 are implemented.

The electrode 120 is formed of a conductive material. Further, the electrode 120 can be formed of a transparent conductive material to ensure light transmittance of the touch sensitive device 100. For example, the electrode 120 can be formed of a transparent conductive material, such as indium tin oxide (ITO), indium zinc oxide (IZO), graphene, a metal nano wire, and transparent conductive oxide (TCO). Further, the electrode 120 can be formed of a metal mesh. That is, the electrode 120 can be configured by a metal mesh in which metal materials are disposed in a mash form so that the electrode 120 can be substantially transparent. However, constituent materials of the electrode 120 are not limited to the above-described examples. Various transparent conductive materials can be used for the constituent materials of the electrode 120. When a plurality of electrodes 120 is provided, the electrodes 120 can be formed of the same material or different materials.

The electrode 120 can be formed by various methods. For example, the electrode 120 can be formed on the electroactive layer 110 using a sputtering method, a printing method, or a slit coating method.

Electroactive Layer

The electroactive layer 110 refers to a layer whose shape is deformed as a voltage is applied and generates a vibration. The electroactive layer 110 of the touch sensitive device 100 according to an exemplary embodiment of the present disclosure is formed of an electroactive matrix in which a piezoelectric ceramic and an electroactive polymer (EAP) are bonded.

The electroactive matrix has a structure in which piezoelectric ceramics and an electroactive polymer are bonded. For example, the piezoelectric ceramic and the electroactive polymer can be bonded to each other by a chemical bond. Specifically, the piezoelectric ceramic and the electroactive polymer can be bonded by a hydrogen bond. A specific structure of the electroactive matrix will be described with reference to FIG. 2.

Figure 2:
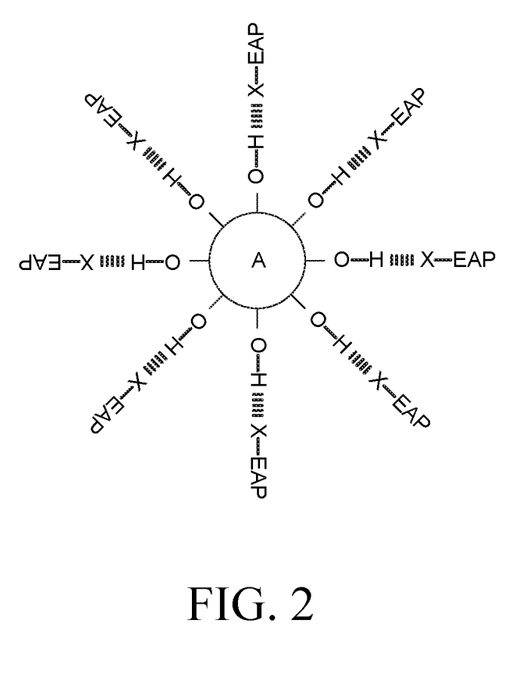
FIG. 2 is a schematic view illustrating a structure of an electroactive matrix which forms an electroactive layer of a touch sensitive device according to an exemplary embodiment of the present disclosure.

FIG. 2 is a schematic view illustrating a structure of an electroactive matrix which forms an electroactive layer 110 of a touch sensitive device 100 according to an exemplary embodiment of the present disclosure.

Referring to FIG. 2, the electroactive matrix includes a core particle A formed of piezoelectric ceramics and an electroactive polymer EAP which chemically bonds to the core particle. More specifically, the electroactive matrix includes a core particle A including a hydroxyl group (—OH) on a surface thereof and an electroactive polymer EAP forming a hydrogen bond with the core particle.

The core particle A of the electroactive matrix is formed of piezoelectric ceramics. In this case, the piezoelectric ceramic is a perovskite type nano particle represented by $ABO_3$ and a surface thereof is modified so that oxygen atoms of the nano particle are substituted with hydroxyl groups.

A periphery of the core particle A is enclosed by the electroactive polymer EAP which bonds to the core particle A, but it is not limited thereto. The electroactive polymer EAP, which encloses the core particle A, can have a shell shape. The electroactive polymer EAP includes a functional group capable of forming a hydrogen bond with a hydroxyl group formed on the surface of the piezoelectric ceramic which forms the core particle A. For example, the electroactive polymer EAP can include a halide group. In this case, the hydrogen bond is formed between the hydroxyl group of the core particle A and a halogen element of the electroactive polymer EAP. In FIG. 2, a structure is illustrated in which one core particle A and eight electroactive polymers EAP form a hydrogen bond, but it is not limited thereto.

The piezoelectric ceramic is a material which generates a voltage when a pressure is applied and generates a mechanical strain when an external electric field is applied so that mechanical vibration energy can be converted into electrical energy, and vice versa.

The piezoelectric ceramic according to an exemplary embodiment of the present disclosure can be a perovskite type nano particle represented by $ABO_3$. Ideally, the piezoelectric ceramic can have a cubic unit structure. A specific structure of the perovskite type nano particle represented by $ABO_3$ will be described with reference to FIG. 3.

Figure 3:
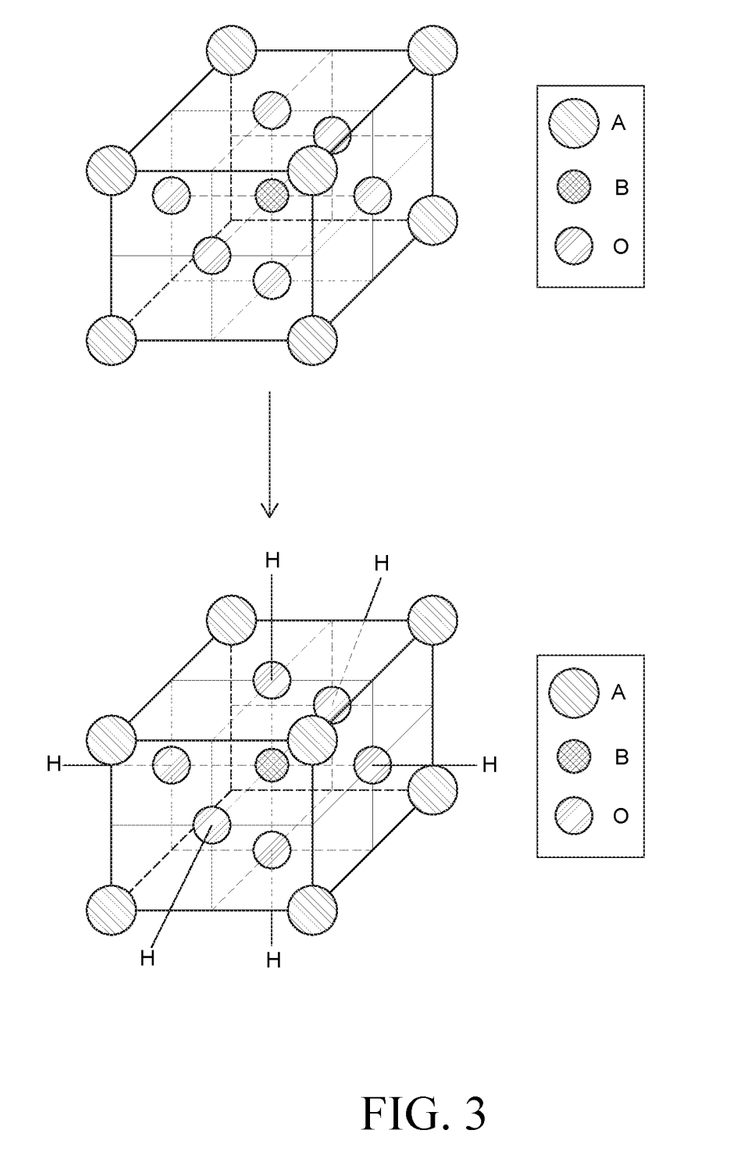
FIG. 3 is a schematic view illustrating a cubic unit structure of a perovskite type nano particle represented by $ABO_3$ and a structure including a hydroxyl group on a surface.

FIG. 3 is a schematic view illustrating a cubic unit structure of a perovskite type nano particle represented by $ABO_3$ and a structure including a hydroxyl group on a surface.

Referring to FIG. 3, elements A and B in the perovskite structure represented by $ABO_3$ exist in the form of ions of the A site and the B site, respectively. For example, in the cubic unit structure, the element A is located at the vertex of the cube and the element B is located at a body center. The O element occupies a face-centered position of the cube in the form of oxygen anion. The perovskite structure of the piezoelectric ceramic can be confirmed by crystal structure analysis by X-ray diffraction or electron beam diffraction. When A, B, and O elements are displaced from corresponding positions of the unit cell, the perovskite structure unit cell is distorted, which results in a tetragonal, anisotropic, or orthorhombic crystal. From the viewpoint of obtaining a piezoelectric ceramic having excellent piezoelectric constant, the crystal system of the piezoelectric ceramic can have a tetragonal structure at room temperature.

Examples of the piezoelectric ceramic according to an exemplary embodiment of the present disclosure can be (Pb, $TiO_3$ (PZT), $BaTiO_3$, (K, Na) $NbO_3$ (KNN), $BiNaTiO_3$ (BNT), $BiKTiO_3$ (BKT), and Bi (Na, K) $TiC_3$ (BNKT). The above-mentioned materials are perovskite type nano particles having a sufficient piezoelectric property and including an oxygen atom and form a hydrogen bond with the electroactive polymer.

Further, the piezoelectric ceramic according to an exemplary embodiment of the present disclosure is not limited thereto, but can be a lead-free material such as (K, Na) $NbO_3$ (KNN), $BiNaTiO_3$ (BNT), $BiKTiO_3$ (BKT), and Bi(Na, K) $TiO_3$ (BNKT). PZT, which is widely used as a piezoelectric ceramic material, is inexpensive and has an excellent piezoelectric property. However, PZT has problems in that it contains a lead (Nb) component, which is harmful to the human body and causes environmental pollution. Therefore, a lead free material which does not contain lead can be desirably used, however, it is not limited thereto.

More desirably, the piezoelectric ceramic can be a KNN based piezoelectric ceramic. Among the above-mentioned lead free materials, the KNN based piezoelectric ceramic is advantageous in that piezoelectric property is strong, residual polarization is large, a phase transition temperature is high, and anti-electric field is low.

The KNN based piezoelectric ceramic according to an exemplary embodiment of the present disclosure can be synthesized by a solid state process. For example, the KNN based piezoelectric ceramic can be manufactured by a solid state process by mixing and then calcinating industrial raw material powders, such as $K_2CO_3$, $Na_2CO_3$, and $Nb_2O_5$, at a high temperature. Further, in order to improve the piezoelectric property, a very small amount of $Ta_2O_5$ and $Li_2CO_3$ is added. Further, a small amount of a commercial dispersant and a bi der, such as polyvinyl butyral (PVB), are added to solvent in which methyl ethyl ketone (MEK) and alcohol are mixed by a ball milling method to be kneaded. In this case, since $Na_2CO_3$ and $K_2CO_3$ have hygroscopicity, $Na_2CO_3$ and $K_2CO_3$ can absorb moisture from the surrounding environment while being stored so that a weight thereof is increased. Therefore, when $Na_2CO_3$ and $K_2CO_3$ are insufficiently dried, a composition can vary as much as an amount of contained moisture, and correspondingly, the piezoelectric property is also changed. Therefore, the piezoelectric ceramic can be manufactured by drying $Na_2CO_3$ and $K_2CO_3$ powders in a drying oven at 90 to 200° C. for 2 to 16 hours to confirm a state in which a weight loss is not caused in accordance with the drying of the previously contained moisture, that is, a complete dried state.

The piezoelectric ceramic, which constitutes the electroactive matrix, can include a hydroxyl group on a surface thereof to form a hydrogen bond with the electroactive polymer. Referring to FIG. 3, in the case of the piezoelectric ceramic having a perovskite type nano particle structure, hydrogen is connected to a part of an oxygen atom occupying a face-centered position to form a hydroxyl group.

The piezoelectric ceramic including a hydroxyl group on a surface thereof can be formed by a surface treatment process. For example, the oxygen atom which constitutes the piezoelectric ceramic is substituted with the hydroxyl group by subjecting the piezoelectric ceramic to a large amount of hydrogen peroxide $H_2O_2$ treatment at a high temperature. The hydroxyl group, which is formed on the surface of the piezoelectric ceramic through the surface treatment process, forms a hydrogen bond with the electroactive polymer to form an electroactive matrix.

The electroactive polymer (EAP) is a polymer material which is deformed by electrical stimulation and can be formed of a dielectric elastomer, such as silicon, urethane, an acryl or a ferroelectric polymer, such as polyvinylidene fluoride polymer; however, it is not limited thereto. The electroactive polymer, which constitutes the electroactive matrix, maintains a polarization state in a natural state so that it can be a ferroelectric polymer having a relatively high dielectric constant.

The electroactive polymer used for the touch sensitive device according to an exemplary embodiment of the present disclosure is bonded to the piezoelectric ceramic to constitute the electroactive matrix. Specifically, the electroactive polymer can be a compound which conforms to a hydrogen bond with the piezoelectric ceramic; however, it is not limited thereto. The electroactive polymer can include a halide group as a functional group so as to form a hydrogen bond with the piezoelectric ceramic.

As an example of the electroactive polymer including a halide group, polyvinylidene fluoride (hereinafter, referred to as PVDF) polymer can be used. The PVDF polymer refers to a polymer including a PVDF repeating unit at a backbone of the polymer. The PVDF polymer is a crystalline polymer having an excellent piezoelectric property and is suitable for the electroactive polymer used for a variable element according to an exemplary embodiment of the present disclosure. The PVDF polymer can be a PVDF homopolymer or a PVDF co-polymer. A fluoro group of the PVDF polymer forms a hydrogen bond with the hydroxyl group formed on the surface of the piezoelectric ceramic, thereby forming an electroactive matrix in which the PVDF polymer is bonded to the piezoelectric ceramic.

As another example of the electroactive polymer including a halide group, polyphosphazene in which a substituted aryloxy group is bonded to a phosphorus atom can be used. In this case, the aryloxy group includes one or more halide groups.

Polyphosphazene refers to a polymer in which the backbone is formed of phosphorus and nitrogen. In this case, phosphorus and nitrogen in the backbone are coupled by a double bond and polyphosphazene can be a linear polymer in which the backbones are connected in a straight line or can be a cyclic polymer in which the backbone extends to connect as a ring. In this case, in order to maximize polarity in the backbone of polyphosphazene, the linear polymer can be used as an electroactive layer, but it is not limited thereto.

An aryloxy group refers to a functional group having an oxygen radical substituted with an aryl group. Here, the aryl group is a compound including one or more aromatic ring systems. Specifically, as examples of the aryl group, a monocyclic aryl group includes a phenyl group, a biphenyl group, and a terphenyl group. A polycyclic aryl group includes a naphthyl group, an anthracenyl group, a phenanthryl group, a pyrenyl group, a perylenyl group, and crycenyl group, but are not limited thereto. For example, the aryloxy group includes phenoxy (also referred to as phenyloxy), naphthoxy, (aka, naphthyloxy), anthracenyloxy, biphenyloxy, rubrenyloxy, and perylenyloxy. In this case, the aryloxy group can have a substituted halogen atom. That is, the polyphosphazene includes an aryloxy group with a substituted halogen atom as a functional group.

The halogen atom substituted in the aryloxy group forms a hydrogen bond with the hydroxyl group formed on the surface of the piezoelectric ceramic, thereby forming an electroactive matrix in which the polyphosphazene and the piezoelectric ceramic are bonded.

More specifically, the electroactive polymer including a halide group can be polyphosphazene including a repeating unit represented by the following Chemical Formula 1.

[Chemical Formula 1]

In Chemical Formula 1, $R_1$ and $R_2$ are the same or different and are each independently a substituted or unsubstituted $C_6$ to $C_{50}$ aryloxy group, and at least one of $R_1$ and $R_2$ is a $C_6$ to $C_{50}$ aryloxy group with at least one substituted halogen atom. In Chemical Formula 1, n is an arbitrary integer. However, it is not limited thereto, and n can be 1000 or larger or desirably, can be 3000 or larger.

Here, the term "substituted or unsubstituted" refers that one or more substituents selected from a group consisting of deuterium, a halogen group, a nitryl group, a nitro group, an amino group, a phosphine oxide group, an alkoxy group, a silyl group, a boron group, an alkyl group, a cycloalkyl group, an alkenyl group, an aryl group, an aralkyl group, an aralkenyl group, an alkylaryl group, an alkylamine group, a heteroarylamine group, an arylamine group, and a heterocyclic group is mono- or poly-substituted or unsubstituted to an aryl portion of an aryloxy group.

More specifically, the substituted aryloxy group can be p-methylphenoxy, 4-vinylphenoxy, ethynylphenoxy, phenylphenoxy, 4-phenylethynylpheoxy, 4-vinylphenylphenoxy, 4-ethynylphenylphenoxy, 4-(phenylethynyl)-phenoxy, decahydronaphthalene-2-oxy, or naphtalene-2-oxy, but is not limited thereto.

Polyphosphazene including a repeating unit represented by Chemical Formula 1 can be an aryloxy group in which at least one of two aryloxy groups substituted in a phosphorus atom is substituted with the halogen atom. Due to the halogen atom having a high electronegativity, the aryloxy group with a substituted halogen atom has a very large polarity as compared with the unsubstituted aryloxy group. When the substituted aryloxy group bonded to the phophorus atom has a large polarity, the degree of polarization of polyphosphazene is increased so that an electroactive layer having a higher piezoelectric property can be provided.

In this case, the aryloxy group with a substituted halogen atom can be fluoro phenoxy represented by the following Chemical Formula 2.

[Chemical Formula 2]

In Chemical Formula 2, X is a halogen atom and a is an integer of 1 to 5.

In this case, polyphosphazene is not limited thereto, and a weight average molecular weight can be 100,000 to 1,000,000 or can be 200,000 to 500,000. When the weight average molecular weight of polyphosphazene satisfies the above-mentioned range, polyphosphazene is easily used to form an electroactive layer and has an excellent piezoelectricity.

For example, the electroactive polymer including a halide group can be poly pentafluorophenoxy/naphtoxy phosphazene represented by the following Chemical Formula 3.

[Chemical Formula 3]

In polyphosphazene represented by Chemical Formula 3, pentafluorophenoxy having a large polarity is substituted as an aryloxy group in one direction of the phosphorus atom and the halogen element forms a hydrogen bond with a hydroxyl group formed on the surface of the piezoelectric ceramics, thereby forming an electroactive matrix.

As another example of the electroactive polymer containing the halide group, a linear boron nitride polymer in which a substituent containing a halogen element is connected to a backbone can be used.

Boron nitride polymer means a polymer in which the backbone is formed of boron and nitrogen. In this case, the backbones are connected in a straight line, which differs from hexagonal boron nitride in which boron and nitrogen form a backbone of a hexagonal ring. Specifically, a typical boron nitride polymer has crystallinity due to a hexagonal ring shape formed by boron and nitrogen and has a plurality of laminated plate structures or a nanotube structure. However, the linear boron nitride polymer has a structure in which the backbone extends in a straight line, similar to a chain structure.

The halogen atom substituted in the linear boron nitride polymer forms a hydrogen bond with the hydroxyl group formed on the surface of the piezoelectric ceramic, thereby forming an electroactive matrix in which the linear boron nitride polymer and the piezoelectric ceramic are bonded.

More specifically, the electroactive polymer including a halide group can be a linear boron nitride polymer including a repeating unit represented by the following Chemical Formula 4.

[Chemical Formula 4]

In Chemical Formula 4, $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, halide group or hydrogen, and $R_4$ is a $C_1$ to $C_{20}$ haloalkyl group or halide group and m is an arbitrary integer.

An α-phase in which fluoro groups are mixed in a trans type or a gauche type through a stretching process is transformed into a β-phase in which the fluoro groups are all-trans type. Therefore, the linear boron nitride polymer can have a constant and high polarity without changing the arrangement of the atoms by a stretching process or a poling process, which differs from the PVDF polymer in which a dielectric constant is ensured. Further, since the arrangement of the atoms is not easily changed at a high temperature, the linear boron nitride polymer has an excellent heat resistance.

The linear boron nitride polymer is not limited thereto, and a weight average molecular weight can be 10,000 to 1,000,000 or can be 100,000 to 500,000. When the weight average molecular weight of linear boron nitride polymer satisfies the above-mentioned range, polyphosphazene is easily used to form an electroactive layer and has an excellent piezoelectricity.

A weight ratio between the piezoelectric ceramic and the electroactive polymer, which constitute the electroactive matrix, can be 1:9 to 9:1. When the content of the piezoelectric ceramic in the electroactive matrix is increased, an excellent dielectric constant is achieved to improve the piezoelectric performance, but the transparency is lowered. In contrast, when the content of the electroactive polymer in the electroactive matrix is increased, the dielectric constant is lowered, but the transparency can be improved. Therefore, a weight ratio between the piezoelectric ceramic and the electroactive polymer can be freely adjusted in accordance with a requested performance. In order to ensure the transparency and implement the flexibility, the weight ratio between the piezoelectric ceramic and the electroactive polymer can be 1:9 to 5:5, but it is not limited thereto.

A thickness of the electroactive layer 110 can be determined such that the touch sensitive device 100 generates a sufficient vibration even at a low driving voltage. For example, the thickness of the electroactive layer 110 can be 10 μm to 50 μm, and more desirably, can be 20 μm to 30 μm. When the thickness of the electroactive layer satisfies the above-mentioned range, the electroactive layer 110 can be formed without causing a crack and generates a sufficient vibration.

The touch sensitive device 100 according to an exemplary embodiment of the present disclosure includes an electroactive layer 110 formed of an electroactive matrix in which the piezoelectric ceramic and the electroactive polymer are bonded. As compared with the piezoelectric ceramic material of the related art, such as PZT, the electroactive matrix in which the piezoelectric ceramic and the electroactive polymer are bonded has an excellent transparency and can be made to be thin so that it is easy to be applied to a product. Further, as compared with the electroactive polymer, such as a PVDF polymer, the electroactive matrix has a significantly excellent dielectric constant to improve the piezoelectricity of the electroactive layer. Therefore, the touch sensitive device according to an exemplary embodiment of the present disclosure can improve light transmittance and vibration intensity.

Further, when a KNN based material is used for the piezoelectric ceramic which constitutes the electroactive matrix, the KNN based material has frame retardation and non-toxic characteristics, which is safer for an operator than the piezoelectric ceramic material of the related art.

Hereinafter, a method for manufacturing an electroactive matrix which constitutes an electroactive layer of a touch sensitive device of the present disclosure will be described.

First, a piezoelectric ceramic material having a perovskite type nanostructure is prepared. For example, a KNN based piezoelectric ceramic can be prepared.

Next, a surface of the KNN is modified with hydrogen peroxide $H_2O_2$ at a high temperature condition to form a hydroxyl group on the surface of the KNN. Hydrogen peroxide is dissociated in the water to form a radical (.OOH) to react with oxygen on the KNN surface to form a hydroxyl group (—OH) on the surface, and then is finally converted into $O_2$.

Next, an electroactive polymer having a halide group is mixed with a piezoelectric material including a hydroxyl group on the surface thereof. Therefore, a hydrogen bond is generated between a halogen element substituted in the electroactive polymer and hydrogen of the piezoelectric ceramic. As a result, the electroactive polymer and the piezoelectric ceramic are bonded to form an electroactive matrix.

However, those skilled in the art can employ any manufacturing method of a piezoelectric ceramic material, any time condition of hydrogen peroxide treatment, any surface treatment condition, any time condition, and any concentration of a reactant.

Figure 8:
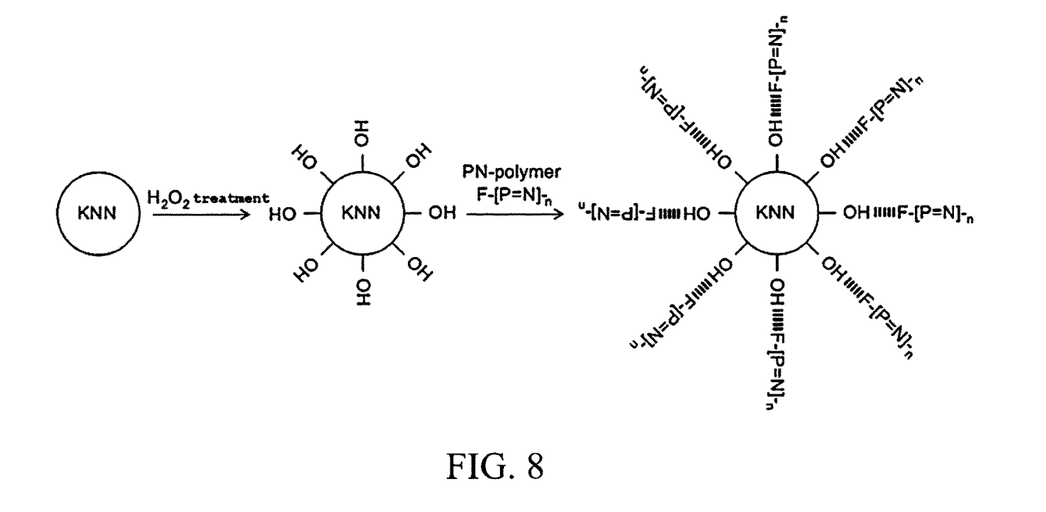
FIG. 8 is a view illustrating a synthetic reaction formula of an electroactive matrix in which the KNN based piezoelectric ceramic and polyphosphazene have a bonded halide group.

A synthetic reaction formula of an electroactive matrix in which the KNN based piezoelectric ceramic and polyphosphazene having a halide group are bonded, by the above-described manufacturing method, is as shown in FIG. 8.

Hereinafter, the effects of the present disclosure relating to the above-described heat resistance will be described in more detail through Examples. However, the following Examples are set forth to illustrate the present disclosure, but the scope of the disclosure is not limited thereto.

Example 1

15 g of $Na_2CO_3$, 15 g of $K_2CO_3$, and 15 g of $Nb_2O_5$ were mixed in 300 mL of ion-exchanged water, and then were heat-treated for two hours using a solid state process to prepare KNN powder.

The prepared KNN powder was mixed with 400 mL of hydrogen peroxide and then heat-treated for six hours at 106° C. to form a hydroxyl group on the KNN surface.

Next, 90% by weight of poly bis(trifluoroethoxy) phosphazene as polyphosphazene and 10% by weight of KNN in which the hydroxyl group was formed were mixed and then stirred to prepare an electroactive matrix in which the KNN and the polyphosphazene formed a hydrogen bond.

Solution casting was performed on the prepared electroactive matrix on an ITO electrode, and then the electroactive matrix was dried to obtain an electroactive active layer having a thickness of 100 μm. Thereafter, ITO was coated on an opposite surface of the prepared electroactive layer to prepare a touch sensitive device in which transparent electrodes were formed on both surfaces.

Comparative Example 1

15 g of $Na_2CO_3$, 15 g of $K_2CO_3$, and 15 g of $Nb_2O_5$ were mixed in 300 mL of ion-exchanged water, and then heat-treated for two hours using a solid state process to prepare KNN powder.

90% by weight of poly bis(trifluoroethoxy) phosphazene as polyphosphazene and 10% by weight of prepared KNN powder were mixed to prepare a mixture in which the KNN and the polyphosphazene were mixed.

Solution casting was performed on the prepared mixture on an ITO electrode, and then the mixture was dried to obtain an electroactive layer having a thickness of 100 μm. Thereafter, ITO was coated on an opposite surface of the prepared electroactive layer to prepare a touch sensitive device in which transparent electrodes were formed on both surfaces.

Experimental Example 1

Measurement of Dielectric Constant

Capacitance was measured using an LCR meter (4284A) and the following Equation 1 was used to calculate dielectric constants of touch sensitive devices prepared by Example 1 and Comparative Example 1. A measurement result is illustrated in FIG. 4.

$$\varepsilon_r = C \times t/A \qquad \text{[Equation 1]}$$

$\varepsilon_r$: dielectric constant, C: capacitance, t: thickness of electroactive layer, A: contact cross-sectional area of electrode)

Figure 4:
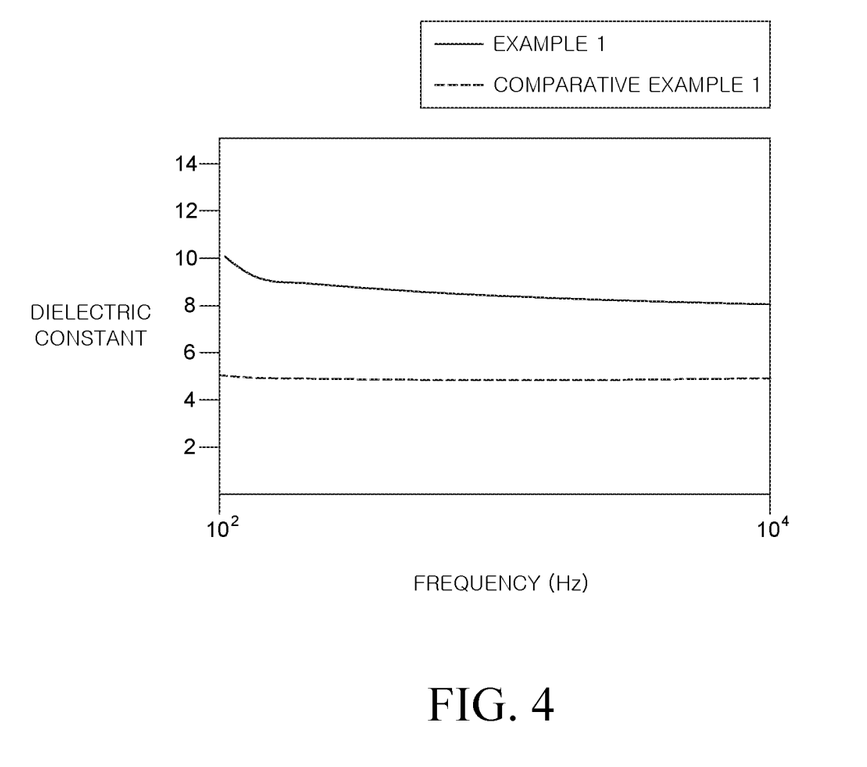
FIG. 4 illustrates results obtained by measuring a dielectric constant of Example 1 and Comparative Example 1.

Referring to FIG. 4, it is confirmed that the dielectric constant in Example 1 in which the piezoelectric ceramic and the electroactive polymer form the electroactive matrix through the hydrogen bond is approximately twice as high than that of Comparative Example 1 in which the piezoelectric ceramic and the electroactive polymer are simply mixed, in the entire frequency area.

Hereinafter, FT-IR analysis in FIGS. 5A and 5B was performed in order to verify whether the electroactive matrix according to an exemplary embodiment of the present disclosure is formed. Specifically, it was verified by comparing an electroactive matrix which was formed by the hydrogen bond of a piezoelectric ceramic modified to include a hydroxyl group on a surface thereof and the electroactive polymer through the process of Example 1 and a mixture in which the piezoelectric ceramic and the electroactive polymer are mixed through the process of Comparative Example 1.

Figure 5A:
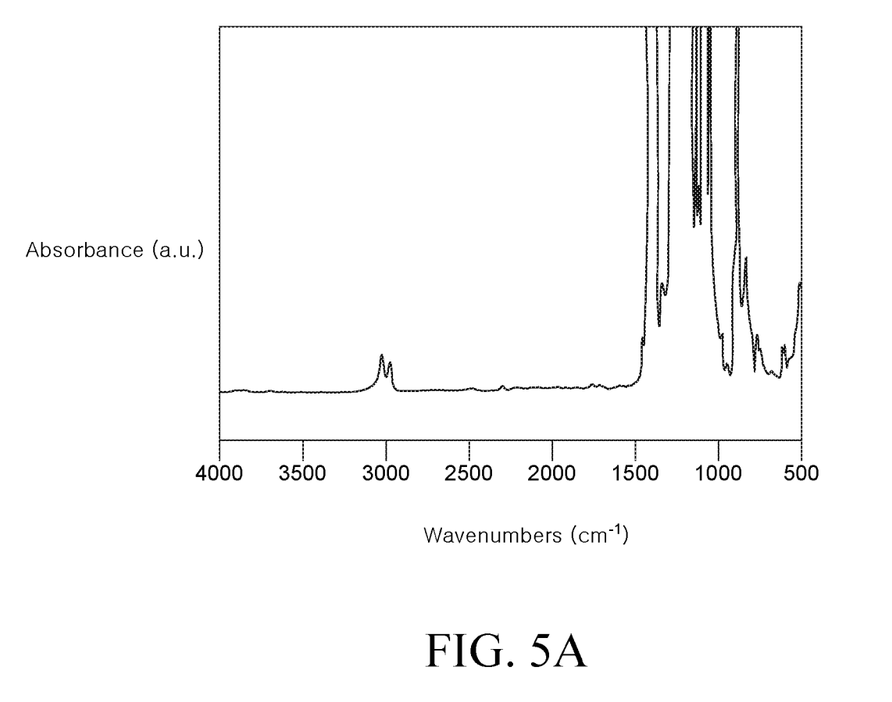
FIGS. 5A and 5B illustrate FT-IR analysis results of Example 1 and Comparative Example 1, respectively.
Figure 5B:
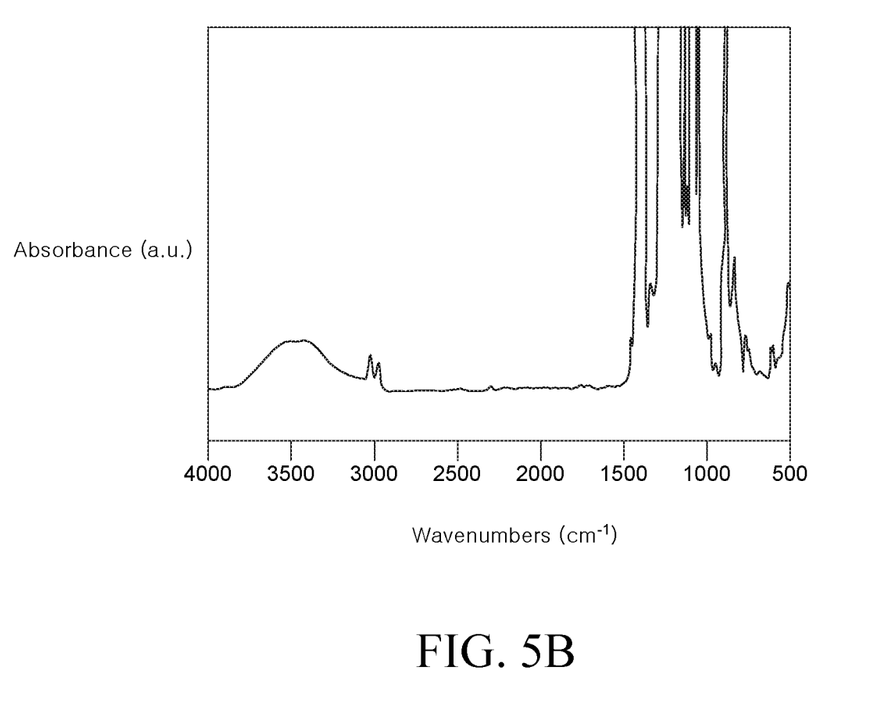

FIGS. 5A and 5B illustrate FT-IR analysis results of Example 1 and Comparative Example 1, respectively. Referring to FIG. 5A, an IR absorbance peak is observed near 3500 $cm^{-1}$. This is because when the modified piezoelectric ceramic including a hydroxyl group and the electroactive polymer form a hydrogen bond, some of the remaining hydroxyl groups which do not participate in the hydrogen bond are detected on the surface of the piezoelectric ceramic. Differing from this, an IR absorbance peak was not observed near 3500 $cm^{-1}$ in FIG. 5B. This proves that there is no hydroxyl group which can form the hydrogen bond on the surface of the piezoelectric ceramic. By doing this, it is possible to estimate whether the hydroxyl group of the piezoelectric ceramic forms a hydrogen bond with the halide group of the electroactive polymer.

Display Device

Figure 6:
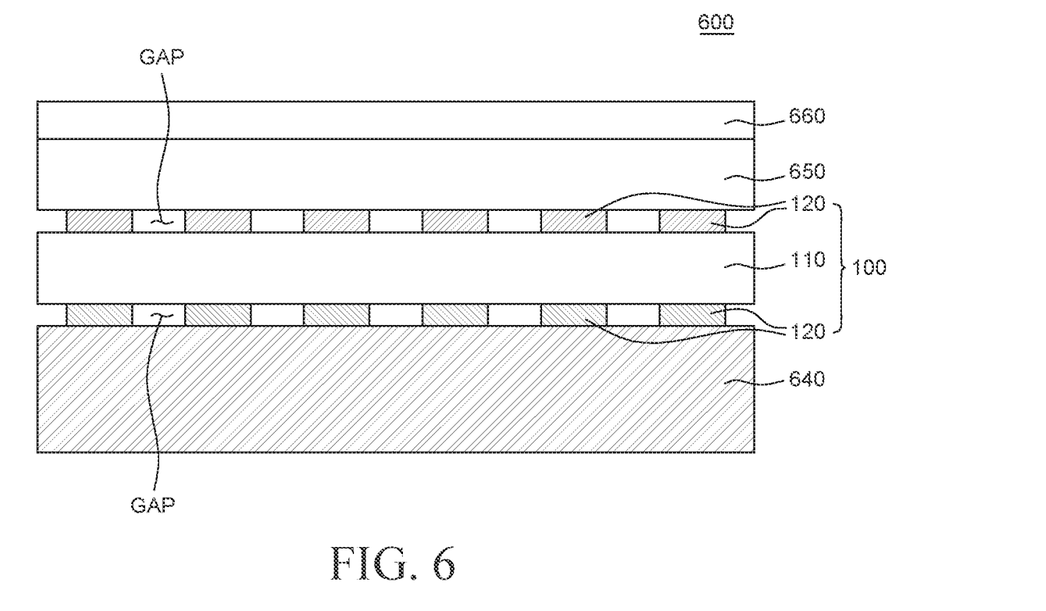
FIG. 6 is a schematic cross-sectional view illustrating a display device according to an exemplary embodiment of the present disclosure.

FIG. 6 is a schematic cross-sectional view illustrating a display device including a touch sensitive device according to an exemplary embodiment of the present disclosure. Referring to FIG. 6, the display device 600 includes a display panel 640, a touch sensitive device 100, a touch panel 650, and a cover 660. In this case, the touch sensitive device 100 included in the display device 600 of FIG. 6 is the same as the touch sensitive device 100 according to an exemplary embodiment, of the present disclosure which has been described with reference to FIG. 1. Therefore, a redundant description of the touch sensitive device 100 will be omitted. Spaces formed between adjacent electrodes 120 constitute gaps (GAP) between the electroactive layer 110 and the touch panel 650 or the display panel 640.

The display panel 640 refers to a panel on which a display device for displaying images is disposed in the display device 600. Various display panels can be used, such as an organic light emitting display panel, a liquid crystal display panel, and an electrophoretic display panel.

The touch panel 650 is disposed on the touch sensitive device 100. The touch panel 650 means a panel which senses a touch input of a user with respect to the display device 600. Various touch panels can be used, such as a capacitive type, a resistive type, an ultrasonic type, or an infrared type can be used, but a capacitive type touch panel. The display device 600 illustrated in FIG. 6 includes an add-on type touch panel in which a separately manufactured touch panel 650 is separately disposed on the display panel 640.

The cover 660 is disposed on the touch panel 650. The cover 660 is a component which protects the display device 600 from the impact outside the display device 600. The cover 660 may be formed of a transparent insulating material.

Even though not illustrated in FIG. 6, an adhesive layer for bonding the display panel 640, the touch sensitive device 100, the touch panel 650, and the cover 660 to each other can be used. For example, as the adhesive layer, an optical clear adhesive (OCA) or optical clear resin (OCR) can be used, but the adhesive layer is not limited thereto.

The touch sensitive device 100 illustrated in FIG. 6 uses the electroactive matrix in which the piezoelectric ceramic and the electroactive polymer are bonded by a hydrogen bond. Accordingly, characteristics of the piezoelectric ceramic having a high piezoelectric property and characteristics of the electroactive polymer which has excellent transparency and is easily made to be thin can be simultaneously included. Therefore, the piezoelectricity and the vibration intensity are excellent so that the tactile sense effect of the display device 600 can be improved. When the KNN based material is used for the piezoelectric ceramic, which constitutes the electroactive matrix, the KNN based material has flame retardation and non-toxic characteristics. Therefore, a display device which is environmentally safer than the display device of the related art using a piezoelectric ceramic material such as PZT can be provided.

Figure 7:
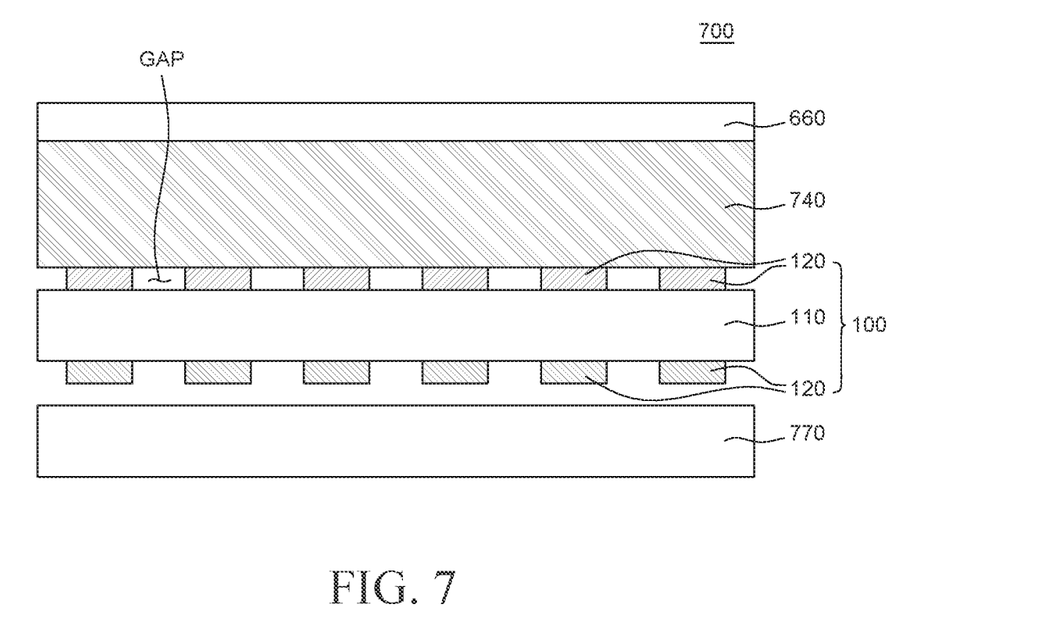
FIG. 7 is a schematic cross-sectional view illustrating a display device according to another exemplary embodiment of the present disclosure.

FIG. 7 is a schematic cross-sectional view illustrating a display device including a touch sensitive device according to another exemplary embodiment of the present disclosure. A display device 700 illustrated in FIG. 7 is different from the display device 600 which has been described with reference to FIG. 6 in that a display panel 740 is a liquid crystal panel so that a backlight unit 770 is further included. Also, an in-cell type touch sensor is configured to be integrated with the display panel 740 instead of the separate touch panel. However, other components are substantially the same so that a redundant description will be omitted. Spaces formed between adjacent electrodes 120 constitute gaps (GAP) between the electroactive layer 110 and the display panel 740.

Referring to FIG. 7, a display panel 740 is disposed between the cover 660 and the touch sensitive device 100. The liquid crystal display panel displays images by adjusting transmittance of light emitted from the backlight unit 770. The liquid crystal panel includes a lower polarizer, a lower substrate including a thin film transistor (TFT), a liquid crystal layer, an upper substrate including a color filter, and an upper polarizer, but is not limited thereto.

The display panel 740 is a panel on which a display element for displaying images in the display device 700 is disposed and includes a touch sensor which is configured to be integrated in the panel. That is, a touch sensor is disposed in the display panel 740 to configure an in-cell type touch sensor. In the in-cell type touch sensor, a common electrode of the display panel 740 is also used as the touch electrode.

Since the display device 700 illustrated in FIG. 7 is a liquid crystal display device, a backlight unit 770 which emits light toward the display panel 740 is disposed below the display panel 740.

The touch sensitive device 100 including an electroactive layer 110 formed by an electroactive matrix in which a piezoelectric ceramic and the electroactive polymer are bonded by a hydrogen bond is disposed between the display panel 740 and the backlight unit 770.

Generally, when the display panel is a liquid crystal display panel and an in-cell type touch sensor is integrated with the display panel and if the touch sensitive device is disposed on the touch sensor, erroneous recognition of the touch input can be caused due to a noise generated by a high driving voltage which is applied to the touch sensitive device. Therefore, the touch sensitive device can be disposed below the display panel. However, when the touch sensitive device is disposed below the display panel, the touch sensitive device is disposed far from the position where the user applies a touch input so that a vibration intensity which is transmitted to the user can be reduced. Therefore, in order to minimize the reduction of the vibration intensity, the touch sensitive device can be disposed between the liquid crystal display panel and the backlight unit. However, as described above, there is a problem in that a shape memory alloy or a piezoelectric ceramic which is used for the touch sensitive device of the related art has a low light transmittance. However, in the display device 700 according to another exemplary embodiment of the present disclosure, the piezoelectric ceramic is modified to form a hydroxyl group on the surface of the piezoelectric ceramic, which then forms a hydrogen bond with the electroactive polymer having a halide group so that a touch sensitive device 100 including an electroactive matrix in which the piezoelectric ceramic and the electroactive polymer are bonded is used. A piezoelectricity of the electroactive matrix in which the piezoelectric ceramic and the electroactive polymer are bonded is significantly higher than that of a case which uses only the electroactive polymer. As a result, the transparency of the piezoelectric ceramic having an opaque characteristic is increased, thereby improving vibration intensity with excellent transparency. Therefore, even when the touch sensitive device 100 is disposed between the liquid crystal panel and the backlight unit, a stronger vibration than that of the related art, which uses the electroactive polymer, can be transmitted with excellent transmittance of light that is supplied from the backlight unit to the liquid crystal display panel.

Exemplary embodiments of the present disclosure can also be described as follows:

According to an aspect of the present disclosure, a touch sensitive device is provided comprising an electroactive layer formed of an electroactive matrix in which a piezoelectric ceramic and an electroactive polymer (EAP) are bonded and an electrode disposed on at least one surface of the electroactive layer.

The piezoelectric ceramic can include a hydroxyl group. The piezoelectric ceramic and the electroactive polymer are bonded by a hydrogen bond.

The piezoelectric ceramic can be a perovskite type nano particle represented by ABO3 and include a hydroxyl group on a surface.

The piezoelectric ceramic can be any one selected from a group consisting of (K, Na) NbO$_3$ (KNN), BiNaTiO$_3$ (BNT), Bi(Na, K) TiO$_3$ (BNKT), and BiKTiO$_3$ (BKT).

The electroactive polymer can include a halide group.
The electroactive polymer can be a ferroelectric polymer.
The electroactive polymer can be PVDF.
The electroactive polymer can be polyphosphazene in which an aryloxy group is substituted in a phosphorus atom.
The polyphosphazene can include a repeating unit represented by the following Chemical Formula 1.

[Chemical Formula 1]

In Chemical Formula 1, $R_1$ and $R_2$ are the same or different and are each independently a substituted or unsubstituted $C_6$ to $C_{50}$ aryloxy group, and at least one of $R_1$ and $R_2$ is a $C_6$ to $C_{50}$ aryloxy group with at least one substituted halogen atom, and n is an arbitrary integer.

$R_1$ can be naphtoxy, phenoxy, or phenylphenoxy and $R_2$ can be fluorophenoxy.

The electroactive polymer can be a linear boron nitride polymer.

The linear boron nitride polymer can include a repeating unit represented by the following Chemical Formula 4.

[Chemical Formula 4]

In Chemical Formula 4, $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, halide group or hydrogen, and $R_4$ is a $C_1$ to $C_{20}$ haloalkyl group or halide group, and m is an arbitrary integer.

According to another aspect of the present disclosure, a display device is provided comprising a display panel and a touch sensitive device above or below the display panel. The touch sensitive device includes an electroactive layer formed of an electroactive matrix in which a piezoelectric ceramic and an electroactive polymer are bonded by a hydrogen bond.

The piezoelectric ceramic can include a hydroxyl group and the electroactive polymer includes a halide group.

The display device can further comprise an add-on type touch panel which is separately disposed on the display panel. The touch sensitive device is disposed between the display panel and the touch panel.

The display panel can be a liquid crystal display panel which includes a touch sensor configured to be integrated in the display panel, a backlight unit disposed below the liquid crystal display panel, and the touch sensitive device is disposed between the liquid crystal display panel and the backlight unit.

Although exemplary embodiments of the present disclosure have been described in detail with reference to the accompanying drawings, the present disclosure is not limited thereto and may be embodied in many different forms without departing from the technical concept of the present disclosure. Therefore, exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A touch sensitive device, comprising:
an electroactive layer formed of an electroactive matrix, wherein the electroactive matrix includes a core particle formed of a piezoelectric ceramic having a hydroxyl group on a surface thereof and a shell enclosing the core particle and formed of an electroactive polymer (EAP) which bonds to the core particle by a hydrogen bond; and
an electrode disposed on at least one surface of the electroactive layer,
wherein the piezoelectric ceramic is a perovskite type nano particle represented by ABO$_3$,
wherein an oxygen atom constituting the piezoelectric ceramic is substituted with the hydroxyl group, wherein the electroactive polymer comprises at least one among a polyphosphazene and a linear boron nitride polymer, wherein the polyphosphazene comprises a repeating unit represented by the following Chemical Formula 1:

[Chemical Formula 1]

wherein $R_1$ and $R_2$ are the same or different and are each independently a substituted or unsubstituted $C_6$ to $C_{50}$ aryloxy group, and at least one of $R_1$ and $R_2$ is a $C_6$ to $C_{50}$ aryloxy group with at least one substituted halogen atom, and n is an arbitrary integer, and wherein the linear boron nitride polymer comprises a repeating unit represented by the following Chemical Formula 4:

[Chemical Formula 4]

wherein $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, halide group or hydrogen, and $R_4$ is a $C_1$ to $C_{20}$ haloalkyl group or halide group, and m is an arbitrary integer.

2. The touch sensitive device according to claim 1, wherein the piezoelectric ceramic is at least one of (K, Na) $NbO_3$ (KNN), $BiNaTiO_3$ (BNT), Bi(Na, K) $TiO_3$ (BNKT), and $BiKTiO_3$ (BKT).

3. The touch sensitive device according to claim 1, wherein the electroactive polymer includes a halide group.

4. The touch sensitive device according to claim 3, wherein the electroactive polymer is a ferroelectric polymer.

5. The touch sensitive device according to claim 3, wherein the electroactive polymer is polyvinylidene fluoride (PVDF).

6. The touch sensitive device according to claim 1, wherein $R_1$ is naphtoxy, phenoxy, or phenylphenoxy and $R_2$ is fluorophenoxy.

7. The touch sensitive device according to claim 1, wherein the piezoelectric ceramic is (K, Na) $NbO_3$ (KNN).

8. The touch sensitive device according to claim 1, wherein the hydroxyl group occupies a face-centered position of the perovskite type nano particle.

9. The touch sensitive device according to claim 1, wherein a weight ratio between the piezoelectric ceramic and the electroactive polymer (EAP) is approximately 1:9 to 5:5.

10. A display device, comprising:
a display panel; and
a touch sensitive device above or below the display panel,
wherein the touch sensitive device includes an electroactive layer formed of an electroactive matrix,
wherein the electroactive matrix includes a core particle formed of a piezoelectric ceramic having a hydroxyl group on a surface thereof and a shell enclosing the core particle and formed of an electroactive polymer (EAP) which bonds to the core particle by a hydrogen bond,
wherein the piezoelectric ceramic is a perovskite type nano particle represented by $ABO_3$, the perovskite type nano particle having a cubic unit structure,
wherein oxygen atoms constituting the piezoelectric ceramic are respectively substituted with the hydroxyl group,
wherein the hydroxyl group occupies face-centered positions of the perovskite type nano particle having the cubic unit structure,
wherein the electroactive polymer comprises at least one among a polyphosphazene and a linear boron nitride polymer,
wherein the polyphosphazene comprises a repeating unit represented by the following Chemical Formula 1:
[Chemical Formula 1]

wherein $R_1$ and $R_2$ are the same or different and are each independently a substituted or unsubstituted $C_6$ to $C_{50}$ aryloxy group, and at least one of $R_1$ and $R_2$ is a $C_6$ to $C_{50}$ aryloxy group with at least one substituted halogen atom, and n is an arbitrary integer, and wherein the linear boron nitride polymer comprises a repeating unit represented by the following Chemical Formula 4:
[Chemical Formula 4]

wherein $R_3$ is a $C_1$ to $C_{20}$ alkyl group, a $C_1$ to $C_{20}$ alkenyl group, a $C_1$ to $C_{20}$ alkynyl group, a $C_5$ to $C_{20}$ aryl group, a $C_3$ to $C_{20}$ cycloalkyl group, a $C_1$ to $C_{20}$ haloalkyl group, halide group or hydrogen, and $R_4$ is a $C_1$ to $C_{20}$ haloalkyl group or halide group, and m is an arbitrary integer.

11. The display device according to claim 10, further comprising:
an add-on type touch panel which is separately disposed on the display panel,
wherein the touch sensitive device is disposed between the display panel and the add-on touch panel.

12. The display device according to claim 10, wherein the display panel is a liquid crystal display panel which includes a touch sensor configured to be integrated in the display panel,
a backlight unit is disposed below the liquid crystal display panel, and
the touch sensitive device is disposed between the liquid crystal display panel and the backlight unit.

13. The display device according to claim 10, wherein the piezoelectric ceramic is at least one of (K, Na) NbO$_3$ (KNN), BiNaTiO$_3$ (BNT), Bi(Na, K) TiO$_3$ (BNKT), and BiKTiO$_3$ (BKT).

14. The display device according to claim 10, wherein R$_1$ is naphtoxy, phenoxy, or phenylphenoxy and R$_2$ is fluorophenoxy.

15. The display device according to claim 10, wherein a weight ratio between the piezoelectric ceramic and the electroactive polymer (EAP) is approximately 1:9 to 5:5.

* * * * *